(12) United States Patent
Pekny

(10) Patent No.: US 7,391,648 B2
(45) Date of Patent: *Jun. 24, 2008

(54) LOW VOLTAGE SENSE AMPLIFIER FOR OPERATION UNDER A REDUCED BIT LINE BIAS VOLTAGE

(75) Inventor: Theodore T. Pekny, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 258 days.

This patent is subject to a terminal disclaimer.

(21) Appl. No.: 11/260,597

(22) Filed: Oct. 27, 2005

(65) Prior Publication Data

US 2006/0077739 A1     Apr. 13, 2006

Related U.S. Application Data (63) Continuation of application No. 11/037,915, filed on Jan. 18, 2005, now Pat. No. 6,990,021, which is a continuation of application No. 10/329,876, filed on Dec. 26, 2002, now Pat. No. 6,868,024.

(51) Int. Cl.
G11C 11/34 (2006.01)
G11C 5/14 (2006.01)

(52) U.S. Cl. .............. 365/185.2; 365/185.21; 365/185.33; 365/226

(58) Field of Classification Search ............ 365/226, 365/205, 207, 208, 185.2, 185.21, 185.33
See application file for complete search history.

(56) References Cited

U.S. PATENT DOCUMENTS

| | | | |
|---|---|---|---|
| 4,752,699 A | 6/1988 | Cranford | |
| 5,453,953 A | 9/1995 | Dhong et al. | |
| 5,537,362 A | 7/1996 | Gill | |
| 5,608,676 A | 3/1997 | Medlock et al. | |
| 5,654,918 A | 8/1997 | Hammick | |
| 5,694,035 A | 12/1997 | Keeth | |
| 5,929,697 A | 7/1999 | Chang | |
| 5,999,460 A | 12/1999 | Oh | |
| 6,075,739 A | 6/2000 | Ihara | |
| 6,108,246 A * | 8/2000 | Umezawa et al. | 365/185.2 |
| 6,118,698 A * | 9/2000 | Akaogi et al. | 365/185.33 |
| 6,781,890 B2 | 8/2004 | Tanaka et al. | |

* cited by examiner

*Primary Examiner*—Trong Phan
(74) *Attorney, Agent, or Firm*—Leffert, Jay & Polglaze P.A.

(57) ABSTRACT

A regulated charge pump, regulated by a plurality of capacitor boost stages and separate from the memory device supply voltage ($V_{cc}$), generates a regulated voltage ($V_{SA}$) over a range of supply voltages. The regulated charge pump powers sense amplifier and differential amplifier circuits of the memory device to permit a low bit line bias voltage. The differential amplifier circuit generates a logical output to indicate a memory cell programmed state that is detected by the sense amplifier circuit.

18 Claims, 10 Drawing Sheets

LOW VOLTAGE SENSE AMPLIFIER FOR OPERATION UNDER A REDUCED BIT LINE BIAS VOLTAGE

RELATED APPLICATIONS

This is a Continuation application of U.S. patent application Ser. No. 11/037,915, filed Jan. 18, 2005, now U.S. Pat. No. 6,990,021, issued Jan. 24, 2006, titled "LOW VOLTAGE SENSE AMPLIFIER FOR OPERATION UNDER A REDUCED BIT LINE BIAS VOLTAGE", which is a Continuation application of U.S. patent application Ser. No. 10/329,876, filed Dec. 26, 2002, now U.S. Pat. No. 6,868,024, issued Mar. 15, 2005, titled "LOW VOLTAGE SENSE AMPLIFIER FOR OPERATION UNDER A REDUCED BIT LINE BIAS VOLTAGE," which is commonly assigned, the entire contents of which are incorporated herein by reference.

BACKGROUND OF THE INVENTION

I. Field of the Invention

The present invention relates generally to memory devices and particularly to supply voltages for sense amplifiers in a memory device.

II. Description of the Related Art

Memory devices are typically provided as internal storage areas in computers. The term memory identifies data storage that comes in the form of integrated circuit chips. There are currently many different types of memory.

One type is random access memory (RAM). This is typically used as the main memory in a computer system. RAM refers to memory that can be both written to and read from. This is in contrast to read only memory (ROM) that permits data to only be read. Most RAM is volatile meaning that it requires a steady flow of power to maintain its contents. When power is turned removed, the data in RAM is lost.

An electrically erasable programmable read-only memory (EEPROM) is a special type of non-volatile ROM that can be erased a byte at a time by exposing it to an electrical charge. EEPROMs comprise a large number of memory cells having electrically isolated gates (floating gates). Data is stored in the memory cells in the form of a charge on the floating gates. The charge is transported to or removed from the floating gates by programming and erase operations, respectively.

A flash memory is a type of EEPROM that can be erased and reprogrammed in blocks instead of one byte at a time. A typical flash memory device comprises a memory array that includes a large number of memory cells arranged in row and column fashion. Each of the memory cells includes a floating gate field-effect transistor capable of holding a charge. The cells are usually grouped into blocks. Each of the cells within a block can be randomly programmed by charging the floating gate. The charge can be removed from the floating gate by a block erase operation. The data in a cell is determined by the presence or absence of the charge in the floating gate.

The memory cells of at least the EEPROM and flash memory devices are coupled through a bit line (also known as a column) to a sense amplifier. When the particular cell is accessed through the row and column signals, that cell is coupled to one input of the sense amplifier. The other input of the sense amplifier may be connected to a reference voltage ($V_{ref}$). The difference between the two voltages determines if the cell has been programmed. If the cell to be read is programmed, it has a greater voltage than the reference voltage. If the cell to be read is erased, it has a smaller voltage than the reference cell.

In a traditional sense amplifier or differential amplifier, the positive supply for the circuit is connected directly to the power supply for the integrated circuit, $V_{cc}$. Typical 1.8V memory devices have a $V_{cc}$ range of 1.60V to 2.2V. Typical 1.5V memory devices have a $V_{cc}$ range of 1.35V to 1.70V. This wide $V_{cc}$ range can cause several problems with memory devices.

During low $V_{cc}$ operation, the sense time gets slower as $V_{cc}$ is reduced. The sense amplifier will eventually stop sensing when $V_{cc}$ goes below a certain threshold.

Conversely, the sensing time improves as $V_{cc}$ increases. However, as $V_{cc}$ increases, the bit line bias to the memory cell also increases. Stressing the bit line with a bias voltage of greater than 0.8V for long periods of time can effectively change its $V_T$. This may show up as a potential read disturb problem. There is a resulting need in the art for a sense amplifier scheme that removes both the low $V_{cc}$ sensing problems as well as the high $V_{cc}$ read disturb problem.

SUMMARY

The present invention encompasses a low voltage sense amplifier device in a memory. The device has a regulated low voltage charge pump that generates a substantially fixed, low dedicated sense amplifier voltage over a large range of supply voltages. The charge pump output voltage is isolated from the supply voltage.

A sense amplifier circuit is coupled to and powered by the regulated low voltage charge pump. The sense amplifier circuit generates differential voltages in response to a sensed current on a bit line of the memory. In one embodiment, the sense amplifier is comprised of a sense portion and a reference portion, each portion having a separate current reference circuit tied to $V_{cc}$.

A differential amplifier circuit is also coupled to and powered by the regulated low voltage charge pump. This circuit generates a logical output signal in response to the differential voltages. The logical output signal represents the charge state of a memory cell that is coupled to the bit line.

DETAILED DESCRIPTION

The embodiments of the low voltage sense amplifier device of the present invention provides a nominal bit line bias voltage while operating at a reduced sense amplifier and differential amplifier supply voltage. This is accomplished by an isolated charge pump that powers sense and differential amplifier circuits with a relatively low, regulated voltage.

Figure 1:
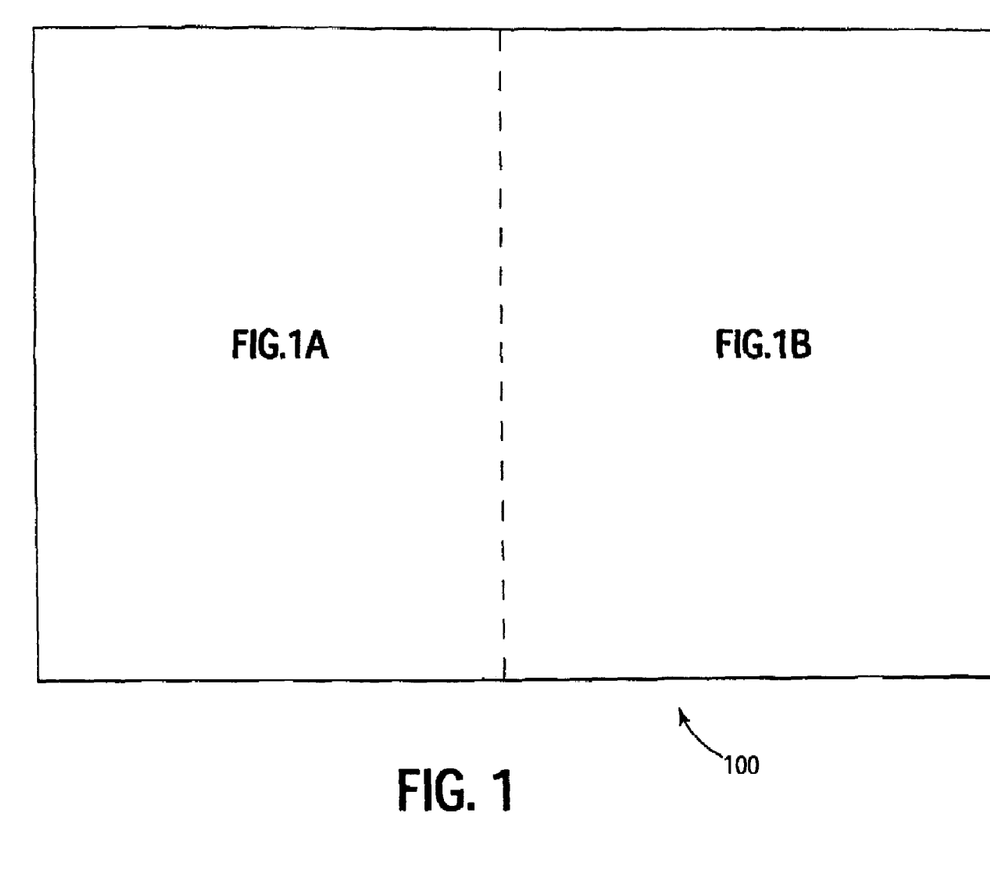
FIGS. 1A and 1B show a schematic diagram of one embodiment of a sense amplifier and differential amplifier device of the present invention.
Figure 1A:
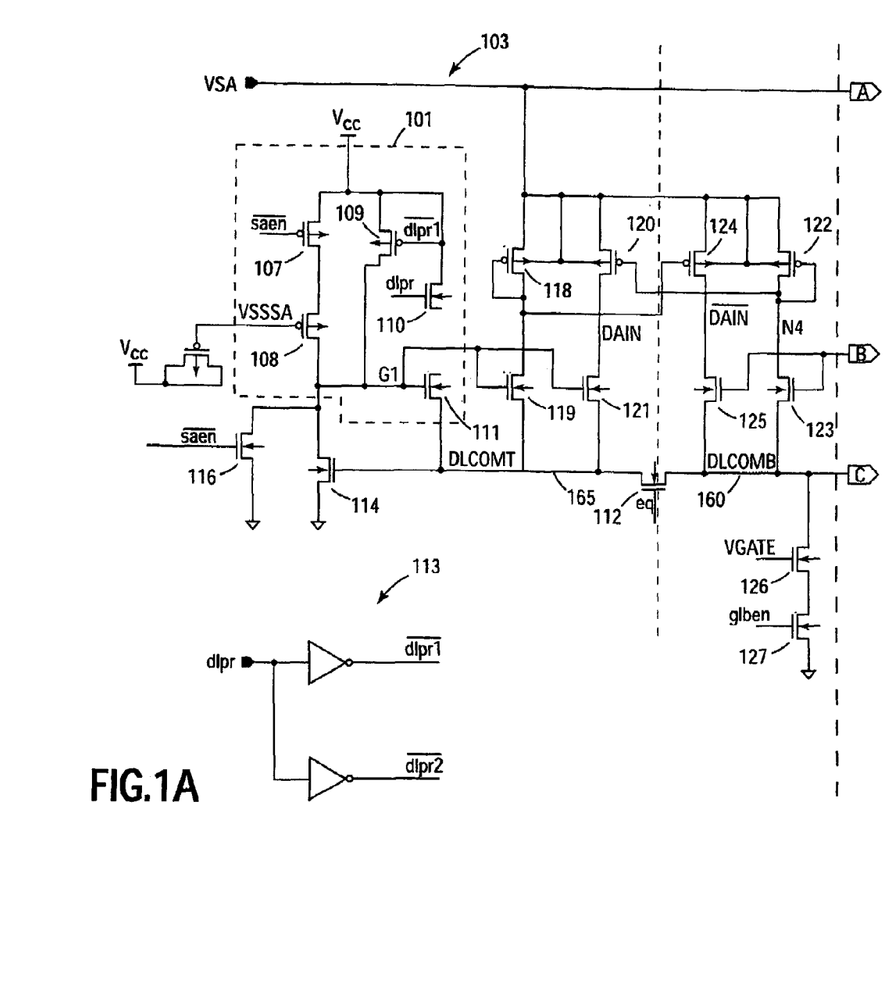
Figure 1B:
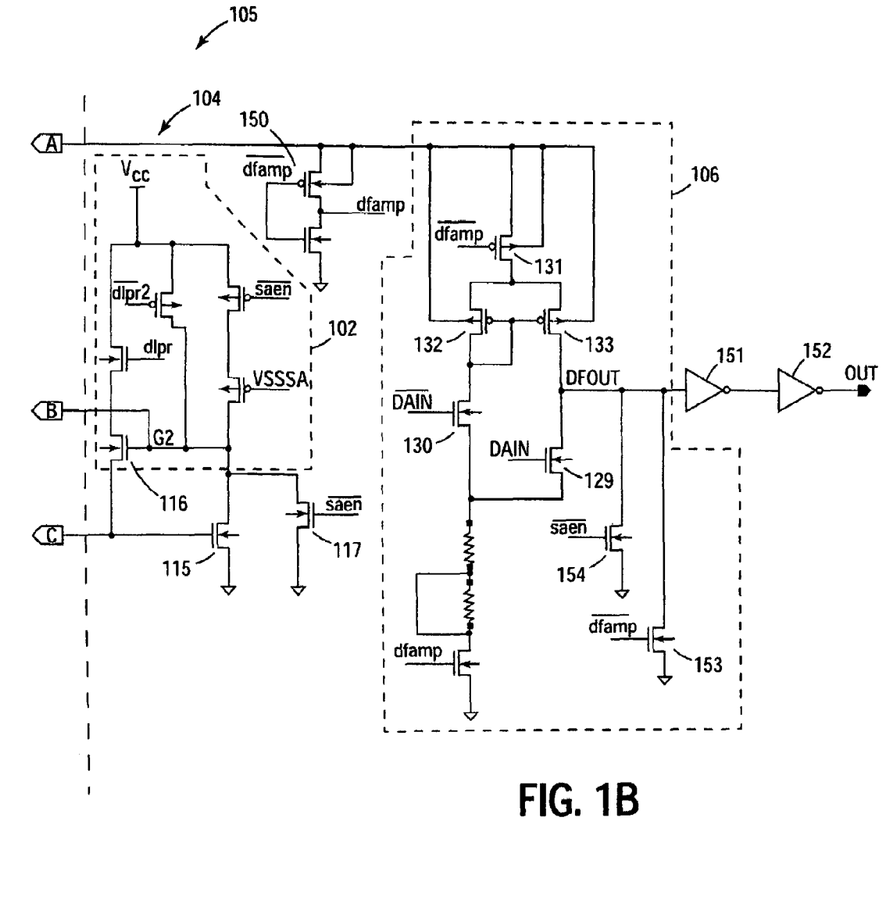

FIGS. 1A and 1B illustrate a schematic diagram of one embodiment of a sense amplifier and differential amplifier apparatus 100 of the present invention. The apparatus 100 is comprised of a sense amplifier circuit 105 and a differential amplifier circuit 106. The low, regulated voltage, $V_{SA}$, of the present invention, powers both sense and differential amplifier circuits 105, 106. In one embodiment, $V_{SA}$ is a regulated 1.80V for the full possible $V_{cc}$ range of approximately 1.30-2.20V (i.e., typical 1.8V memory devices have a $V_{cc}$ range of 1.60V to 2.2V and typical 1.5V memory devices have a $V_{cc}$ range of 1.35V to 1.70V). The generation of this voltage is described in greater detail with reference to FIGS. 2 and 3. Alternate embodiments use other voltage levels depending on the application.

A sense amplifier enable signal, saen*, goes low to enable the sense and differential amplifier apparatus 100 of the present invention. The sense amplifier enable signal is a function of the chip enable (i.e., CE*) signal that enables the memory device. When the chip enable signal is a logic low, the sense amplifier enable signal goes low as well. A processor coupled to the memory device may generate the chip enable signal. Alternate embodiments use different logic levels for these signals.

The sense amplifier circuit 105 is further divided into a sense circuit 103 and a reference circuit 104. Each circuit 103, 104 is a mirror image of the other circuit, differing mainly in the function for which they are used.

The sense circuit 103 of FIG. 1A of the sense amplifier portion 105 is responsible for sensing current flow through a bit line (also known as a data line) of the memory array and converting it to a voltage for use as described subsequently. In one embodiment, the sensed current is approximately 18 µA. Other embodiments sense different current levels. The operation of memory array bit lines is well known in the art and is not discussed further.

The reference circuit 104 of FIG. 1B is responsible for generating the reference voltage to which the sense circuit 103 voltage is compared. In one embodiment, the reference voltage generated is 1.8 V. Alternate embodiments use other voltage levels.

Since the sense amplifier portion 105 is powered by a regulated 1.8 V $V_{SA}$, the sense amplifier portion 105 is optimized for that condition by a separate current reference circuit 101 as a biasing circuit. This circuit 101 includes five transistors 107-111 that have $V_{cc}$ as the power source. As seen later with reference to FIG. 3, $V_{SA}$ is isolated from $V_{cc}$.

The sense biasing circuit 101 of FIG. 1A is enabled by the sense amplifier enable signal, saen*, that turns on one of the transistors 107 thus causing current to flow through a second transistor 108. The gate of the second transistor 108 is tied to a signal, $V_{SSSA}$, that is a filtered ground when the sense amplifier is on.

Two other transistors 109, 110 of the sense biasing circuit 101 are turned on by a data line precharge signal, dlpr, and its complement, dlpr1*. These transistors 109, 110 are only pulled up, through a fifth transistor 111, during the time that dlpr is high.

The data line precharge signal is a relatively short pulse width signal that assists the bit line in charging prior to a read operation on the memory array. In one embodiment, the precharge signal is on the order of nanoseconds. The two complement signals of dlpr, dlpr1* and dlpr2*, are generated by an inverter circuit 113 of the present invention.

The three transistors 109-111 attempt to pull up the sense circuit 103 to $V_{cc}$. Once the sense circuit 103 reaches $V_{cc}$, the fifth transistor 111 starts to turn on and pull G1 down. The sense biasing circuit 101 is attempting to bias the sense circuit 103 to the $V_T$ of another transistor 114. This biasing, in one embodiment, is not a single, stable voltage. It will be in a range of voltages as the circuit continues to operate.

The reference biasing circuit 102 performs substantially the same task in substantially the same way as in the sense biasing circuit 101. The reference biasing circuit 102 pulls up the reference circuit 104 at point G2 to the $V_{cc}$ voltage level when saen*, dlpr, and dlpr2* are active. Once DLCOMB 160 reaches $V_{cc}$, a transistor 116 turning on pulls G2 down. This attempts to bias the reference circuit to the $V_T$ of another transistor 115. This biasing, in one embodiment, is not a single, stable voltage. It will be in a range of voltages as the circuit continues to operate.

Two transistors 116, 117 are used as circuit deselects. When the sense amplifier apparatus 100 is off, one transistor 116 pulls the sense circuit to ground when saen* is high. Similarly, the second transistor 117 pulls the reference circuit to ground when saen* is high. These transistors 116, 117 prevent $V_{SA}$ and $V_{cc}$ current from going back to a data line when the apparatus 100 is not operational.

The sense circuit 103 has two transistors 118, 119 that attempt to pull up the sense circuit 103 to $V_{SA}$. One transistor 118 is connected as a diode. These transistors 118, 119 will pull up the sense circuit 103 to an intermediate bias level voltage between the $V_T$ of the p-channel transistor 118 and the voltage on DLCOMT 165. This circuit is mirrored on the reference circuit 104 in transistors 122, 123. These transistors 122, 123 pull up the reference circuit 104 to an intermediate bias level voltage between the $V_T$ of the p-channel transistor 122 and the voltage on DLCOMB 160.

Another transistor 120 in the sense circuit 103 has a gate connection coupled to N4 in the reference circuit. Similarly, a transistor 124 in the reference circuit 104 has a gate connection coupled to N2 in the sense circuit 103. While one transistor 120 or 124 is pulling high, the other transistor 124 or 120 is pulling low. This amplifies the analog output signals, DAIN and DAIN*, of the sense amplifier circuit 105 through transistors 121 and 125 respectively.

The sense circuit 103 and the reference circuit 104 are equalized when a sense cycle is initiated. A transistor 112 that is connected between the two circuits performs the equalization. The equalization is initiated when an equalization signal, eq, goes high.

The equalize signal, is a high going pulse that is generated in response to a toggle of the memory device's chip enable line, a change in the address lines to the memory device, or some other sense cycle initiating condition. In one embodiment, the pulse is a high-going pulse having a duration in the range of 20-25 ns. Alternate embodiments use pulses having different durations and/or inverse logic levels.

Additional transistors 126, 127 are used to set up the reference voltage on the reference side 104. These transistors 126, 127 are controlled by signals $V_{GATE}$ and glben respectively.

$V_{GATE}$ is a voltage that, in one embodiment, is 1.10V. glben is a control signal that is "on" (high) during the sense amplifier read mode and "off" (low) when the read mode is off. When glben is high and $V_{GATE}$ is 1.10 V, the transistors 126, 127 draw current through the reference circuit 104 to set up the reference voltage.

An inverter circuit 150 creates the complementary signal (dfamp) of a differential amplifier enable signal dfamp*. When dfamp* goes low, the differential amplifier is enabled.

The differential analog outputs of the sense amplifier 105 are denoted as DAIN and DAIN*. These signals are input to the differential amplifier circuit 106 along with the control signals saen*, dfamp, and dfamp*. The differential amplifier circuit 106 is responsible for amplifying DAIN and DAIN* and outputting a logical one when DAIN is high and a logical low when DAIN is low. The differential amplifier circuit 106 outputs the signal through two buffers 151, 152 for signal conditioning and isolation.

DAIN* is connected to an input transistor 130 on one side of the circuit 106 while its complement, DAIN, is connected to an input transistor 129 on the other side of the circuit. Additional transistors 131-133 are pulled up to $V_{SA}$. The differential amplifier enable signal, dfamp* going low turns on one transistor 131 allowing the transistors 132, 133 having their gates coupled together to amplify the DAIN signals.

The differential amplifier circuit 106 output, DFOUT, can be disabled when either the sense amplifier apparatus enable signal saen* or the complementary differential amplifier enable signal dfamp* goes high. In either case, a transistor 152 or 153 respectively is turned on and pulls DFOUT to ground.

Figure 2:
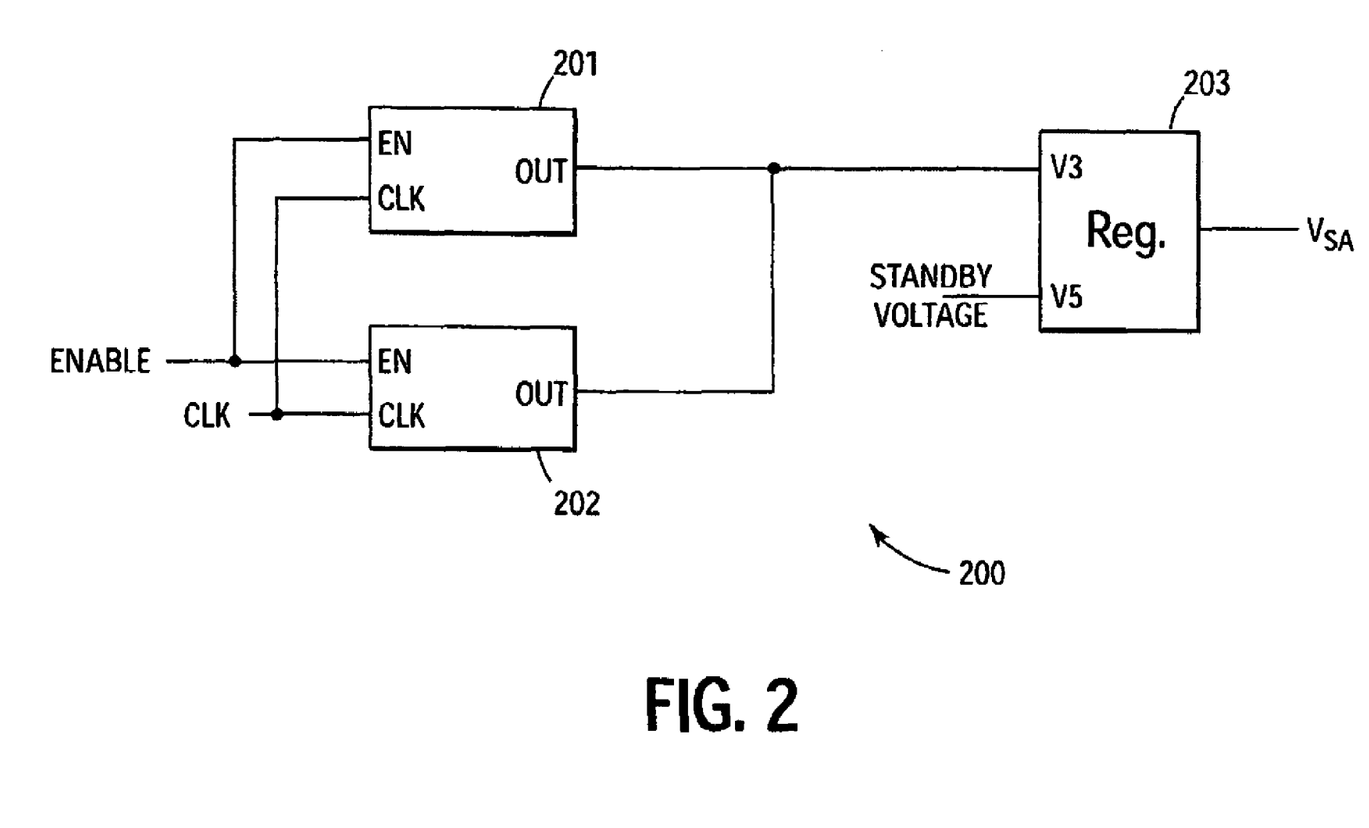
FIG. 2 shows a block diagram of one embodiment of a regulated voltage generation circuit of the present invention.

FIG. 2 illustrates a block diagram of one embodiment of the regulated $V_{SA}$ generation circuitry 200 of the present invention. The present invention employs two regulated charge pumps 201, 202 in order to increase the current available to the other circuits of the memory device. Both charge pumps 201, 202 are coupled to a clock signal CLK that clocks the circuitry of the charge pump as well as an enable signal ENABLE that enables/disables the charge pumps 201, 202. The enable signal is generated by control circuitry (not shown) when a read operation is performed on the memory array. One embodiment of the charge pumps of the present invention is illustrated in greater detail in FIG. 3 as described subsequently.

The circuitry of FIG. 2 additionally has a voltage regulator to regulate the charge pumps' output as well as select between the V3 voltage for normal operations and the V5 voltage for stand-by operations. The V3 voltage, in one embodiment, is 1.80 V. V5 is selected when the memory device is put into a sleep mode and only a small current is required to maintain volatile control register settings.

Figure 3:
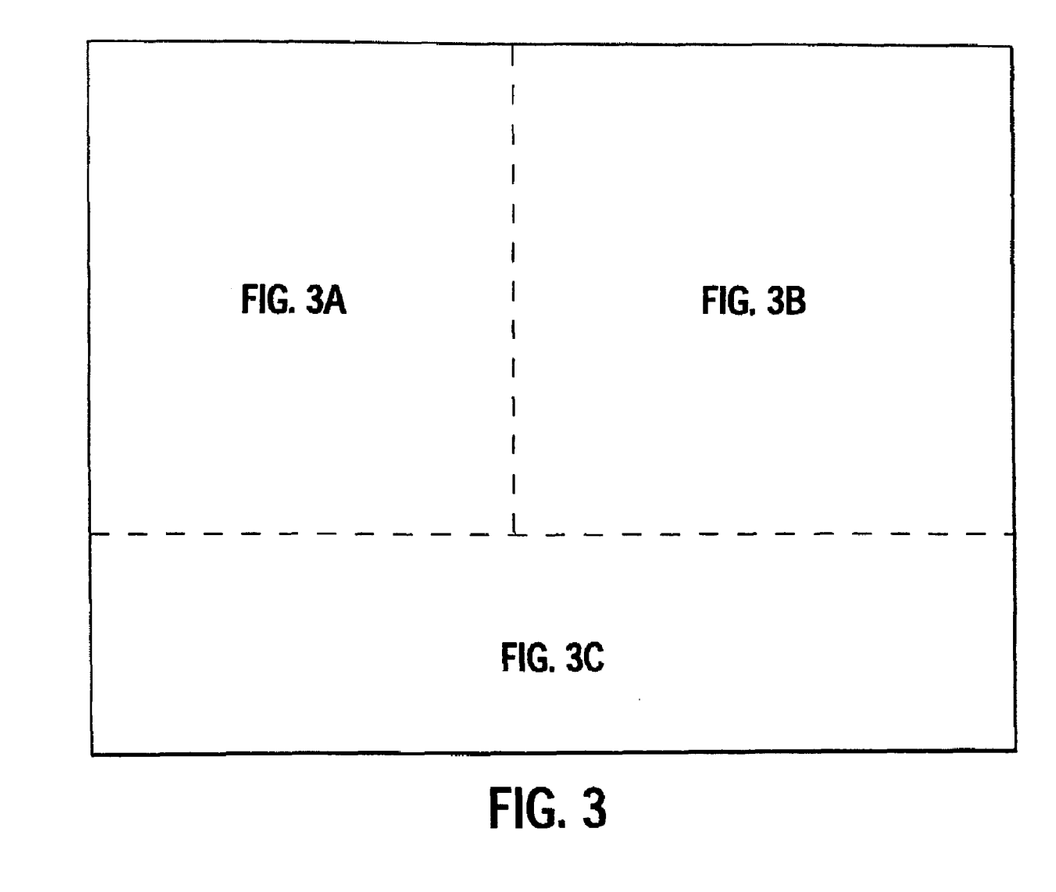
FIGS. 3A, 3B, and 3C show a schematic diagram of one embodiment of a regulated charge pump in accordance with the embodiment of FIG. 2.
Figure 3A:
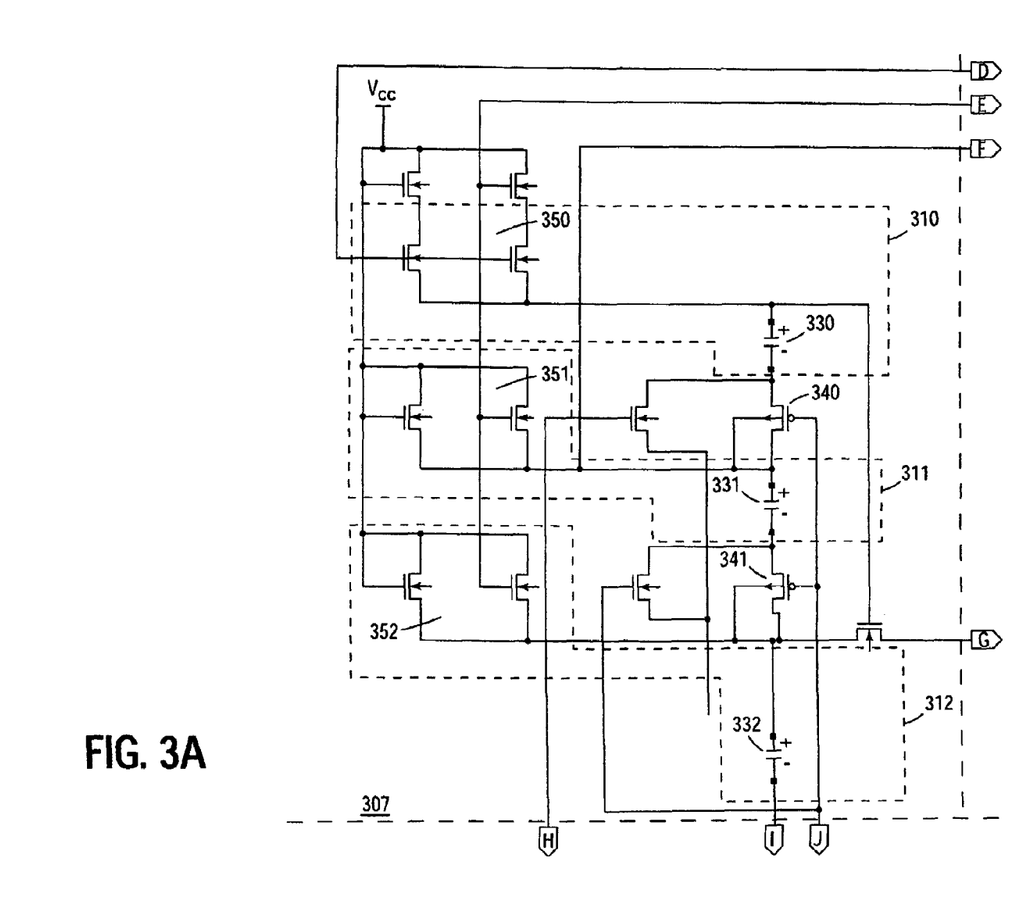
Figure 3B:
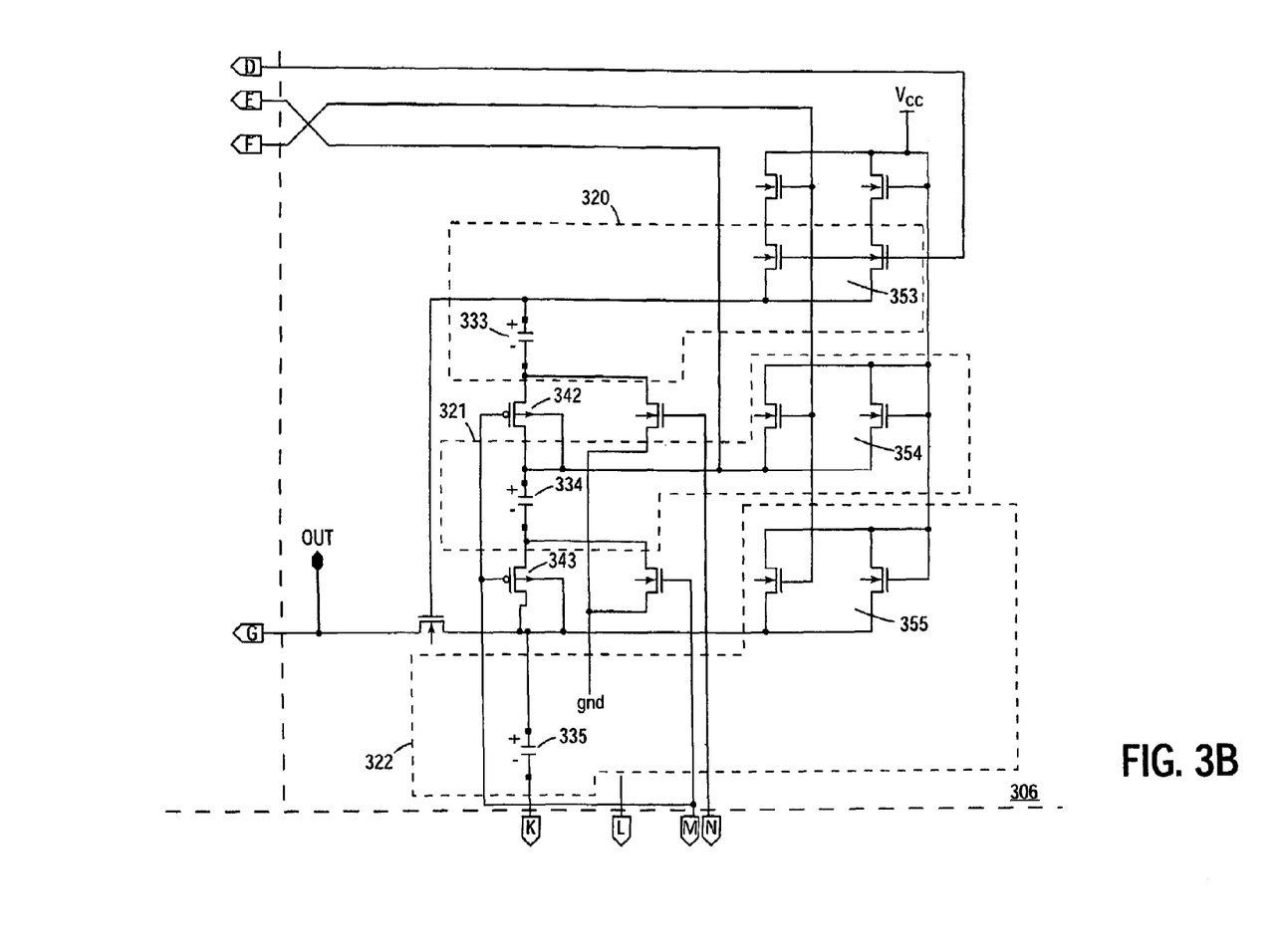
Figure 3C:
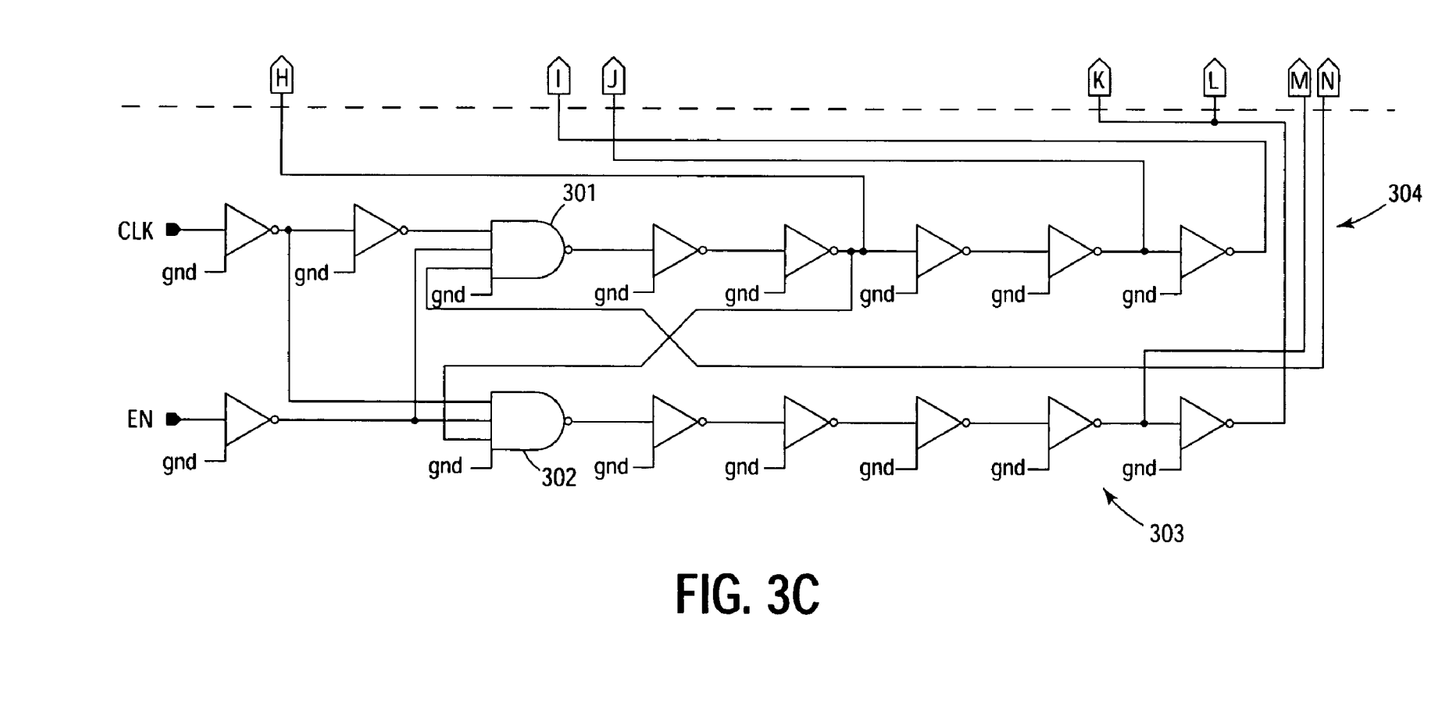

FIG. 3 illustrates a schematic diagram of one embodiment of a regulated charge pump of the present invention. The clock input CLK is coupled to a network of buffers 303, 304 that provide the clock signal at different delays and logic levels for the remainder of the charge pump circuitry. The clock is enabled through two NAND gates 301, 302 by the enable signal "EN". The remainder of the charge pump circuitry is broken up into two voltage generation circuits 306, 307 that are substantially identical to each other. One network of buffers 303 clocks one circuit 306 while the other network of buffers 304 clocks the remaining circuit 307.

The two voltage generation circuits 306, 307 are each broken up into three stages 310-312 and 320-322. Each stage 310-312 and 320-322 is made up of a network of transistors 350-355 respectively that charge a stage capacitor 330-335 respectively depending on the state of the clock signal.

Initially, the capacitors 330-335 are in parallel when the transistors 340-343 between the capacitors 330-335 are turned off. The capacitors 330-335 are then charged through the network of transistors 350-355 that is coupled to a particular capacitor. Each network of transistors 350-355 is pulled up to $V_{cc}$ in order to charge that particular stage's capacitor 330-335.

On the next clock state, the transistors 340-343 between the capacitors 330-335 are turned on and the capacitors 330-335 are wired in series such that the voltages across each capacitor 330-335 is summed with the others.

Each voltage generation circuit 306, 307 outputs its voltage in response to the state of the clock. For example, when the clock signal is high, the first voltage generation circuit 306 outputs its voltage. When the clock signal is low, the second voltage generation circuit 307 outputs its voltage. The output of the embodiment of FIG. 3 is input to a voltage regulator for regulation.

The regulated charge pump circuitry of FIG. 3 is for purposes of illustration only. Alternate embodiments using different components and configurations can be used to generate the same or substantially similar results.

Figure 4:
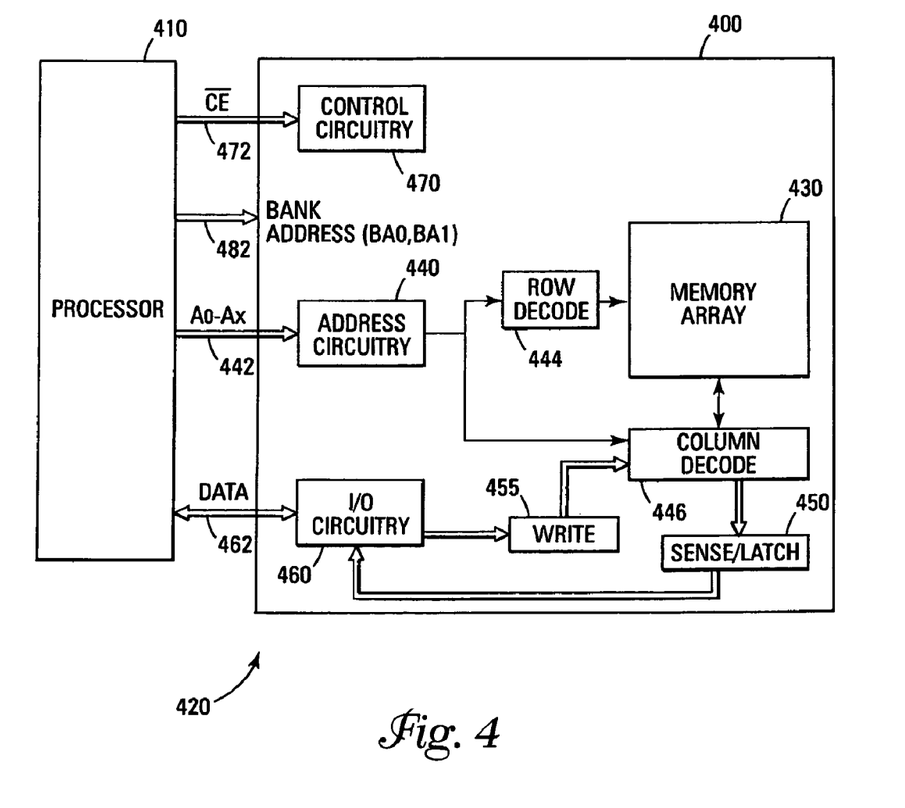
FIG. 4 shows a block diagram of one embodiment of a memory system of the present invention.

FIG. 4 illustrates a functional block diagram of a flash memory device 400 of one embodiment of the present invention that is coupled to a processor 410. The flash memory device 400 and the processor 410 may form part of an electronic system 420. The flash memory device 400 has been simplified to focus on features of the memory that are helpful in understanding the present invention.

The flash memory device includes an array of memory cells 430. The memory cells are non-volatile floating-gate memory cells. The memory array 430 is arranged in banks of rows and columns.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

Additional bank address lines 482 are used to access the different banks of the memory array 430. In one embodiment of the present invention, there are four memory banks. In such an embodiment, two bank address lines, BA1 and BA0, are required to activate each memory bank. For example, if memory bank 3 is desired to be activated, from memory banks 0, 1, 2, and 3, then BA1=1 and BA0=1. If a memory embodiment has different quantities of memory banks, different quantities of bank select lines may be required.

The flash memory device 400 reads data in the memory array 430 by sensing voltage or current changes in the memory array columns using sense/latch circuitry 450. The sense/latch circuitry 450, in one embodiment, is coupled to latch a row of data from the memory array 430. The low voltage sense amplifier device of the present invention is encompassed in the sense/latch circuitry 450 and is coupled to the bit lines of the memory array 430.

Data input and output buffer circuitry 460 is included for bidirectional data communication over a plurality of data (DQ) connections 462 with the processor 410. Write circuitry 455 is provided to write data to the memory array.

A command control circuit 470 decodes signals provided on control connections 472 from the processor 410. In one embodiment, the control circuit 470 is comprised of a state machine that executes the functions of the memory array 430, including data read, data write, and erase operations.

In the embodiment illustrated in FIG. 4, the processor 410 generates the address, data, and control lines to the memory device 400. Alternate embodiments may use other controllers to generate these signals in an electronic system 420. Additionally, the memory device 400 may be coupled to something other than a controller or processor that generates the address, data, and control signals.

The flash memory device illustrated in FIG. 4 has been simplified to facilitate a basic understanding of the features of the memory. A more detailed understanding of internal circuitry and functions of flash memories are known to those skilled in the art.

Figure 5:
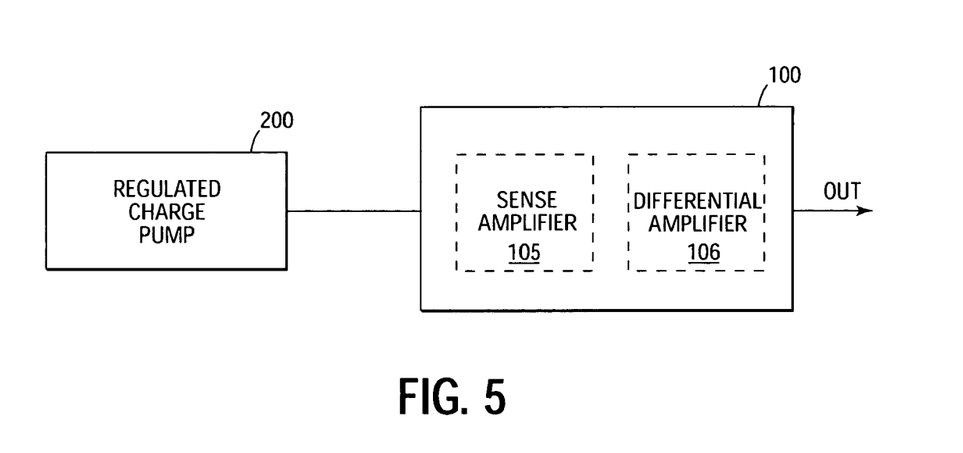
FIG. 5 shows a block diagram of one embodiment of the present invention of the sense amplifier and differential amplifier apparatus powered by the regulated charge pump.

FIG. 5 illustrates a block diagram of one embodiment of the present invention of the sense amplifier and differential amplifier apparatus 100 powered by the regulated charge pump 200. In this embodiment, the regulated charge pump 200 provides the regulated voltage to the apparatus 100 that is comprised of the sense amplifier circuit 105 and differential amplifier circuit 106. FIG. 1 illustrates one implementation of the apparatus 100 and FIG. 2 illustrates one implementation of the regulated charge pump 200. These circuits 100, 200 may be implemented using different components and/or component architectures.

In summary, the embodiments of the present invention provide a low voltage sense amplifier and differential amplifier device that operates under a reduced bit line bias voltage. A regulated charge pump that is isolated from $V_{CC}$ produces a regulated voltage for a large range of $V_{cc}$ voltages while allowing the bit line bias to remain well below 0.8 V.

Numerous modifications and variations of the present invention are possible in light of the above teachings. It is therefore to be understood that within the scope of the appended claims, the invention may be practiced otherwise than as specifically described herein.

What is claimed is:

1. A memory system comprising:
   a non-volatile memory device comprising:
      a non-volatile memory array having a plurality of memory cells;
      a low voltage sense amplifier device having a regulated low voltage charge pump to produce a substantially fixed charge pump voltage in response to a range of supply voltages, a sense amplifier circuit coupled to the regulated low voltage charge pump and powered by the charge pump voltage, for generating differential voltages in response to a sensed current on a bit line of the non-volatile memory device and a chip enable signal for the non-volatile memory device, and a differential amplifier circuit, coupled to and powered by the charge pump voltage, for generating a logical output signal in response to the differential voltages; and
   a plurality of data connections coupled to the non-volatile memory device and configured to provide contact between the memory system and a processor.

2. The device of claim 1 wherein the charge pump voltage is 1.8V for the range of the supply voltages of 1.35 to 2.20V.

3. The device of claim 1 wherein the sense amplifier circuit is comprised of a plurality of transistors that are powered by the range of supply voltages.

4. The device of claim 1 wherein the sense amplifier circuit comprises a current reference circuit to generate a reference current for the sense amplifier circuit.

5. The device of claim 1 wherein the logical output signal indicates a programmed state of a memory cell coupled to the bit line.

6. The device of claim 5 wherein a bit line bias to the memory cell is less than 0.8 V.

7. A memory system comprising:
   a flash memory device comprising:
      a non-volatile memory array having a plurality of memory cells;
      a low voltage sense amplifier device in a flash memory having a regulated low voltage charge pump that generates a regulated voltage in response to a clock signal and an enable signal, a sense amplifier circuit, powered by the regulated voltage, for generating differential voltages in response to a chip enable signal to the flash memory device and a sensed current on a bit line coupled to a first memory cell, the sense amplifier circuit having a sense circuit and a reference circuit, and a differential amplifier circuit, powered by the regulated voltage, for generating a logical output signal in response to the differential voltages, the logical output indicating a programmed state of the first memory cell; and
   a plurality of data connections coupled to the flash memory device and configured to provide contact between the memory system and a processor.

8. The device of claim 7 wherein the clock signal and the enable signal of the regulated low voltage charge pump are input to a first and second plurality of delay gates to generate a plurality of delayed clock signals and a plurality of delayed enable signals.

9. The device of claim 8 wherein the first and second current reference circuits are powered by a voltage source that is different from the regulated low voltage charge pump.

10. The device of claim 7 wherein the sense circuit and the reference circuit are equalized by an equalization circuit in response to an equalization signal.

11. The device of claim 10 wherein the equalization circuit is comprised of a transistor and the equalization signal is generated in response to at least one of the chip enable signal or a change in state of address lines to the flash memory.

12. A memory system comprising:
   a flash memory array having a plurality of bit lines coupled to a plurality of memory cells, the memory array coupled to a first supply voltage, a clock signal, a plurality of address lines, and a chip enable signal;
   a regulated low voltage charge pump that generates a fixed second supply voltage in response to and range of supply voltages, the clock signal, and the chip enable signal;
   a sense amplifier circuit comprising a sense circuit and a reference circuit that are equalized by an equalization circuit in response to one of the chip enable signal or a state change of the plurality of address lines, the sense amplifier circuit powered by the second supply voltage and generating differential voltages in response to a sensed current on at least one bit line of the plurality of bit lines;
   a differential amplifier circuit, powered by the second supply voltage, for generating a logical output signal in response to the differential voltages; and
   a plurality of data connections coupled to the flash memory array and configured to provide contact between the memory system and a processor.

13. The memory device of claim 12 wherein the sensed current varies in response to a programmed state of a read memory cell.

14. The memory device of claim 12 and further comprising a precharge circuit that precharges a bit line prior to a read operation of a memory cell coupled to the bit line.

15. A method for operating a memory system having a flash memory device comprising a sense amplifier device coupled to a memory array to provide nominal bit line biasing of flash memory cells in the flash memory device, the method comprising:
   providing a regulated voltage to a sense amplifier circuit, comprising a sense circuit and a reference circuit, that is coupled to memory array bit lines in response to a range of supply voltages, a clock signal, a plurality of address lines, and a chip enable signal;

equalizing the sense circuit and the reference circuit;
providing the regulated voltage to a differential amplifier circuit;
the sense amplifier circuit generating differential voltages in response to sensed current on the memory array bit lines;
the differential amplifier circuit generating a logical one or a logical zero signal in response to the differential voltages; and
communicating over data connections of the memory system with the flash memory device.

16. The method of claim 15 and further including generating a separate current reference, each from a different current reference circuit, for a sense circuit and a reference circuit of the sense amplifier circuit.

17. The method of claim 15 wherein the equalizing is performed in response to the chip enable signal.

18. The method of claim 15 wherein the equalizing is performed in response to a change in state of the plurality of address lines.

* * * * *